United States Patent [19]

Loehr et al.

[11] Patent Number: 4,903,818
[45] Date of Patent: Feb. 27, 1990

[54] APPARATUS FOR INSERTING AND/OR REMOVING PRINTED CIRCUIT BOARDS INTO AND FROM SLOTTED CHANGE PALLETS

[75] Inventors: Hans-Guenter Loehr, Calw; Gunter Herrmann, Wiernsheim, both of Fed. Rep. of Germany

[73] Assignee: Loehr & Herrmann GmbH, Neuhausen, Fed. Rep. of Germany

[21] Appl. No.: 196,499

[22] Filed: May 20, 1988

[30] Foreign Application Priority Data

May 26, 1987 [DE] Fed. Rep. of Germany ....... 3717628

[51] Int. Cl.⁴ .............................................. B65G 25/00
[52] U.S. Cl. .................................... 198/409; 198/431; 271/185
[58] Field of Search ........................ 198/409, 431, 345; 271/31.1, 184, 185

[56] References Cited

U.S. PATENT DOCUMENTS

| 4,276,979 | 7/1981 | Buschmann | 198/409 X |
| 4,502,585 | 3/1985 | Sticht | 198/345 |
| 4,613,032 | 9/1986 | Berger et al. | 198/409 |

FOREIGN PATENT DOCUMENTS

| 1290484 | 3/1969 | Fed. Rep. of Germany | 198/409 |
| 1301012 | 9/1969 | Fed. Rep. of Germany | 198/431 |
| 3606110 | 8/1987 | Fed. Rep. of Germany | 198/345 |
| 468843 | 7/1975 | U.S.S.R. | 198/409 |
| 796141 | 1/1981 | U.S.S.R. | 271/184 |
| 2067510 | 7/1981 | United Kingdom | 198/409 |

Primary Examiner—Robert J. Spar
Assistant Examiner—James R. Bidwell
Attorney, Agent, or Firm—Balogh, Osann, Kramer, Dvorak, Genova & Traub

[57] ABSTRACT

An apparatus is disclosed which serves to insert and/or remove printed circuit boards into and out of slotted change pallets which are adapted to hold printed circuit boards in a generally vertical orientation and out of contact with each other. A roller conveyor is provided for conveying each printed circuit board in a horizontal orientation into a pivoted board holder or gripper, which is adapted to grip the printed circuit board preferably at its leading edge and to move the printed circuit board to a position in which the printed circuit board is substantially vertical and disposed over one of the slots formed in a change pallet that has been positioned below the board holder or gripper. The board holder or gripper is adapted to perform an outward pivotal movement from the bottom edge of the generally vertical board as the change pallet is advanced further.

18 Claims, 9 Drawing Sheets

APPARATUS FOR INSERTING AND/OR REMOVING PRINTED CIRCUIT BOARDS INTO AND FROM SLOTTED CHANGE PALLETS

BACKGROUND OF THE INVENTION

1. Field of the Invention

This invention relates to an apparatus for inserting and/or removing printed circuit boards into and from slotted change pallets which are adapted to hold printed circuit boards in a generally vertical orientation and out of contact with each other.

2. Description of the Prior Art

It is known that printed circuit boards can be inserted and removed in a horizontal or vertical direction by means of stackers. But in that case, adjacent printed circuit boards will contact each other as they are transported. It is also known that printed circuit boards can be inserted into and removed from respective pockets of conveyors but in that case only one printed circuit board can be transported in a given pocket. Said apparatuses operate by positive circulation in that a printed circuit board is inserted during each cycle of operation and another printed circuit board is removed on the other side during the same cycle. The pockets are fixedly connected to the apparatus and occupy a large space.

It is also known to use slotted change pallets, which are also known as "slotted plates" and into which the printed circuit boards are inserted by hand. The slots of the slotted plates have such a pitch that the printed circuit boards held in the slotted plates will not contact each other. That requirement must be met in the manufacture of printed circuit boards at least as far as those surface portions of the printed circuit boards are concerned which are sensitive to touch, e.g., when the protective film has been peeled from printed circuit plates which have been exposed to light.

SUMMARY OF THE INVENTION

It is an object of the invention to provide an apparatus for an automatic insertion and/or removal of printed circuit boards into and from slotted change pallets, which are adapted to hold the printed circuit boards in a substantially vertical orientation and without a contact between adjacent printed circuit boards and which can easily be exchanged.

In an apparatus of the kind described first hereinbefore that object is accomplished in accordance with the invention in that a roller conveyor is provided for conveying each printed circuit board in a horizontal orientation into a pivoted board holder or gripper, which is adapted to grip the printed circuit board preferably at its leading edge and to move the printed circuit board to a position in which the printed circuit board is substantially vertical and disposed over one of the slots formed in a change pallet that has been positioned below the board holder or gripper. The board holder or gripper is adapted to perform an outward pivotal movement from the bottom edge of the generally vertical board as the change pallet is advanced further. The board holder or gripper performs a short continued pivotal movement below the level of the associated slot so that the board holder or gripper departs from the printed circuit board, which remains in the slot of the change pallet. The sliding movement of the board holder or gripper along the edge of the printed circuit board will not be detrimental because the printed circuit board will always have a free margin which can be engaged by the board holder or gripper to hold the printed circuit board.

To ensure that the printed circuit board will reliably be introduced into the board holder or gripper and will be held in position in the board holder or gripper during its pivotal movement, the gripper may comprise a plurality of pairs of fixed and movable gripping jaws. Said paris are distributed over the width of the apparatus. The movable gripping jaws are operated in unison by means of a pneumatic cylinder, which is secured to the pivoted arm which carries the gripper. As a result, the printed circuit boards may enter the apparatus at any desired location, either individually or as a set of juxtaposed boards, and need not be aligned before they are inserted into the pallet.

To permit a pivotal movement of the gripping jaws under the level of the slots, each pallet consists of a base plate and a plurality of slotted bars, which are secured to the base plate on top thereof. Gaps are defined between adjacent bars and the gripping jaws can enter that gaps. The depth of the slot is only one-half of the thickness of the bars. The gripping jaws can be pivotally moved to a position below the level on which the printed circuit boards are supported in the slots. When the gripper has been pivotally moved to its lower position the pallet is advanced by one slot pitch so that the gripper can subsequently be pivotally moved back to its upper position without contacting the previously deposited printed circuit board.

To ensure that the advance of the change pallet will exactly be controlled, the change pallet is placed on a pallet carriage, which constitutes a part of the apparatus, and is fixed on the pallet carriage exactly in a predetermined position by means of stops and/or pawls. The pallet carriage is guided in a direction of travel by longitudinal tracks. A notched bar having an exactly predetermined notch pitch is attached to the underside of the pallet carriage and is engageable by a pawl for advancing the carriage. The pawl is pivoted to the frame of the apparatus and is operated by two pneumatic cylinders.

When the pallet has been advanced by one slot pitch, the pallet is clamped in the position which has been reached. This is accomplished by a clamping mechanism, which comprises a retaining bar, which is fixed to the pallet carriage. The clamping mechanism will be locked when the pallet carriage has performed its forward step and will be unlocked before the beginning of the next cycle of operations. When the pallet has been entirely filled, the advance of the pallet carriage is terminated and the pallet carriage carrying the pallet is pushed by hand in the direction of travel until the pallet or the pallet carriage engages a stop. The pallet is then unlocked on the pallet carriage and is displaced transversely to the direction of the previous travel, e.g., onto a transport carriage.

When the apparatus is used to remove printed circuit boards from the pallet the described operations are performed in the reverse sequence. If the apparatus is used only for removing the printed circuit boards from the pallet and for inserting the printed circuit boards into a machine, it will be sufficient to provide a board holder which has rigid U-shaped hooks rather than fixed and movable gripping jaws.

Figure 1:
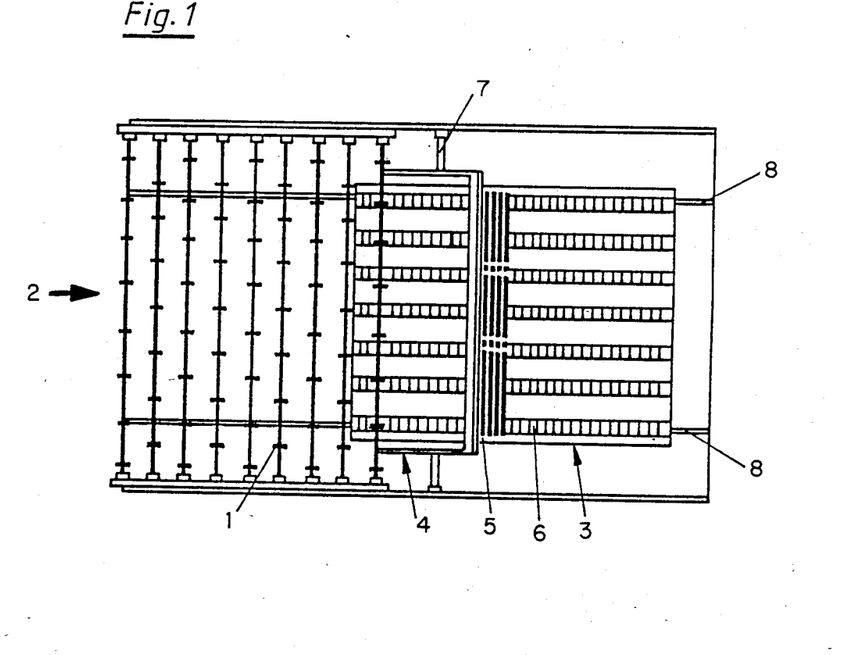
FIG. 1 is a top plan view of an embodiment of the apparatus in accordance with the invention.
Figure 2:
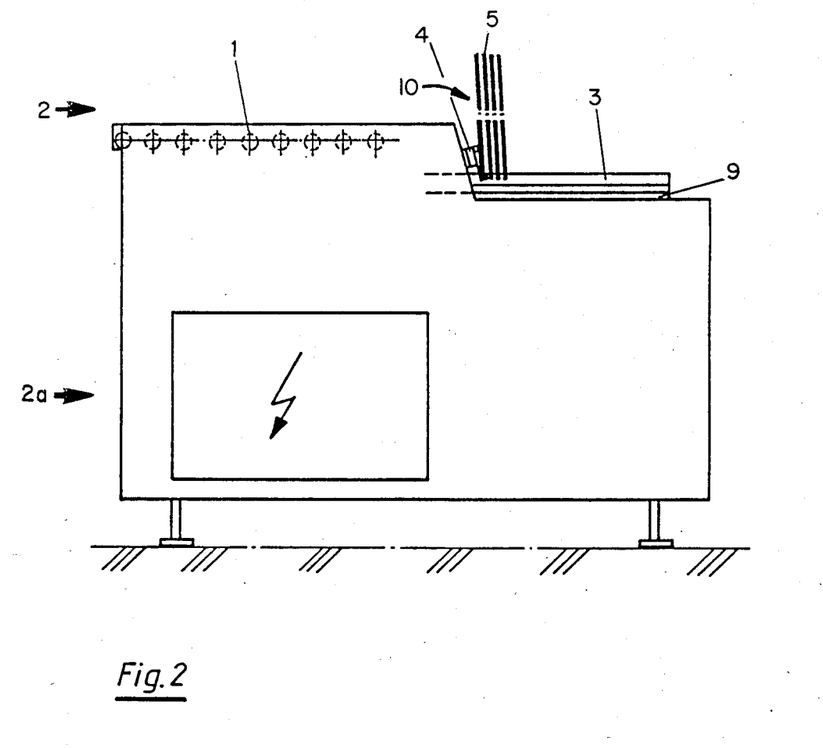
FIG. 2 is a side elevation showing the apparatus of FIG. 1.

The entire apparatus shown in FIG. 1 in a top plan view comprises a horizontal conveyor, which consists of a set of synchronously driven rollers 1 having horizontal axes of rotation. The arrow 2 indicates the direction of travel in which the conveyor will be operated when it is used to remove printed circuit boards from a machine disposed in front of the conveyor and to insert the printed circuit boards into the pallet 3. A board holder or gripper 4 is shown in a position for inserting a printed circuit board 5 into one of the slots 18 which are formed by laterally aligned, open-topped notches formed in notched bars 6 of the pallet 3. The gripper is pivoted on a pivot 7, which is transverse to the direction of travel 2 of the conveyor 1. The pallet 3 lies on top of a pallet carriage 9, which is movable along tracks 8 in the direction of travel 2. From FIG. 2 showing the entire apparatus in a side elevation the pallet carriage 9 is apparent and the direction of the pivotal movement of the gripper for inserting the printed circuit board into the change pallet is indicated by the arrow 10.

Figure 3:
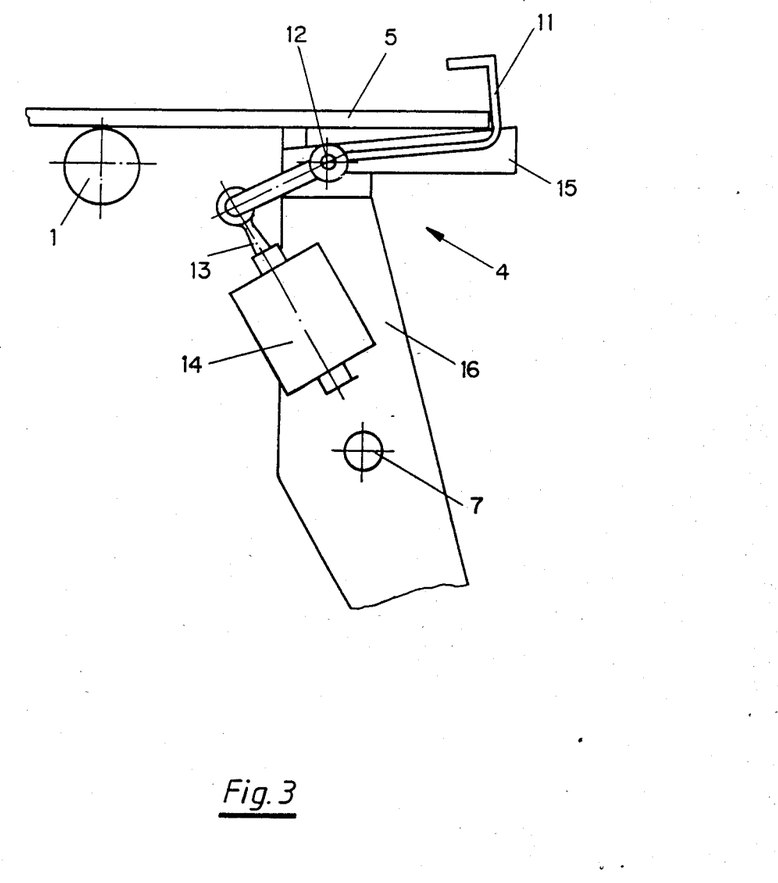
FIG. 3 and 4 show the pivoted gripper as it receives and grips a printed circuit board.
Figure 4:
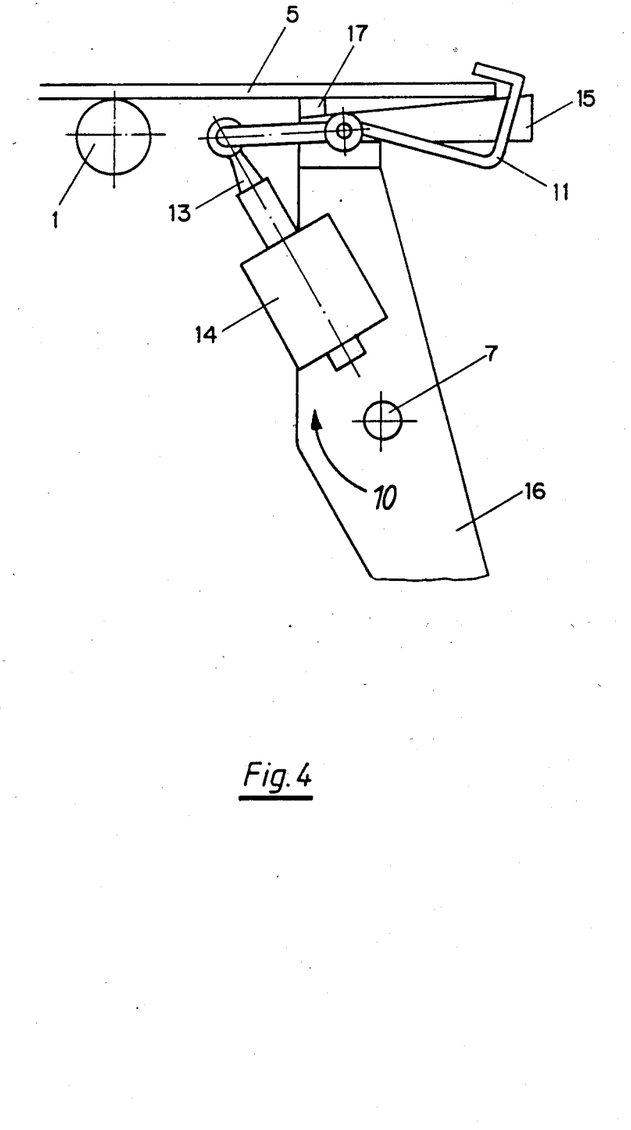
Figure 5:
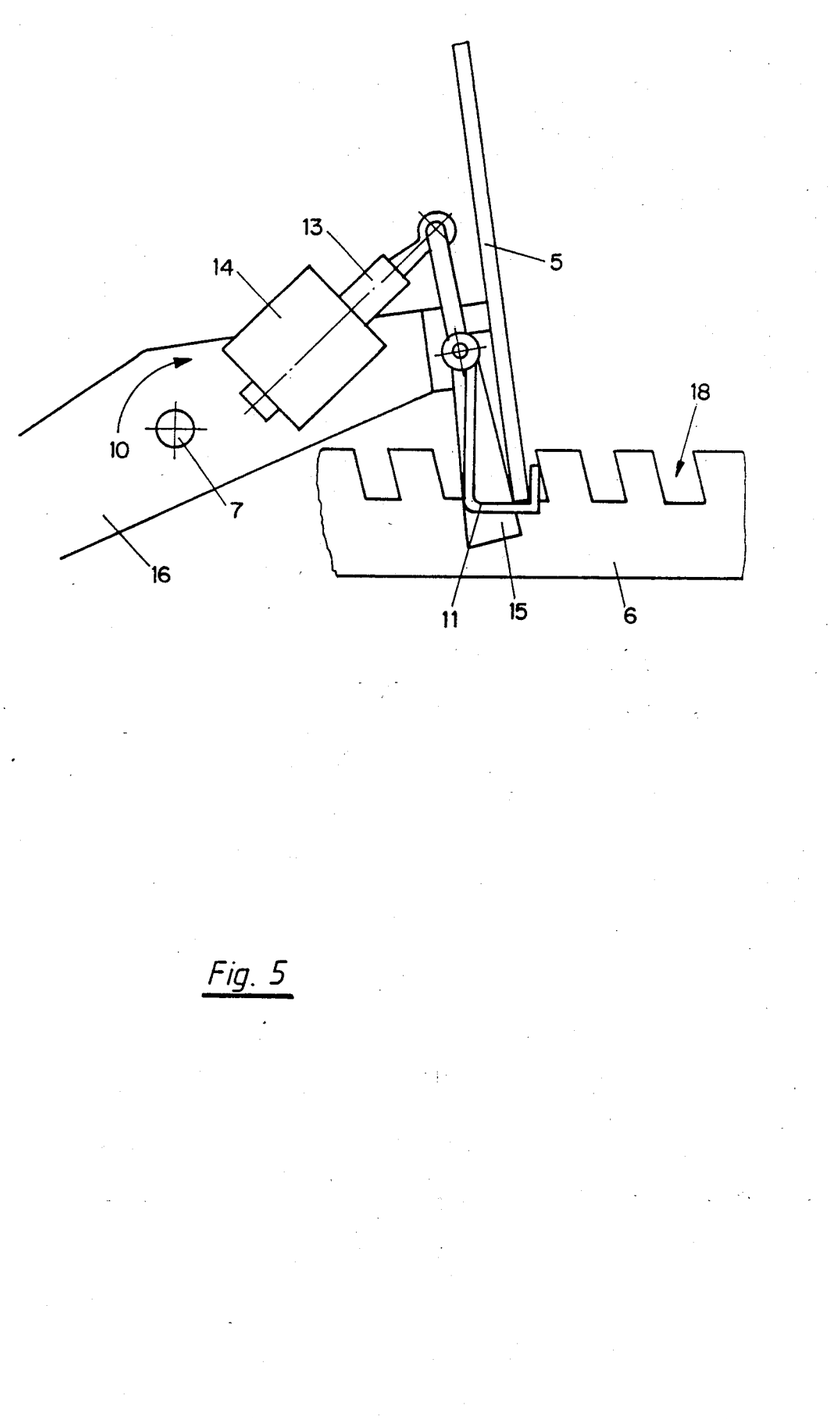
FIG. 5 illustrates the insertion of the printed circuit boards into the slots of the change pallet.

FIG. 3 is a fragmentary side elevation showing a portion of the gripper 4 as the printed circuit board 5 is received by the gripper when its movable gripping jaws 11 are open. The gripping jaws 11 are actuated about the pivot 12 by means of a piston rod 13, which is moved by the cylinder 14. The fixed gripping jaws 15 are directly secured to the pivoted arm 16 of the gripper 4. It is apparent from FIG. 4 how the printed circuit board 5 is gripped between the movable and fixed gripping jaws 11 and 15 when the piston rod 13 has been extended from the cylinder 14 and that the printed circuit board is supported in that position by a bar 17. From FIG. 5 it is apparent how the printed circuit board 5 is inserted into one of the slots 18 which are formed by the notched bars 6 when the gripper has performed a pivotal movement through about 80°. Thereafter the pivoted arm 16 performs a small further pivotal movement to push the printed circuit board 5 out of the gripper. The further pivotal movement is effected through such an angle that the movable gripping jaws 11 will be disposed under the lower edge of the printed circuit board 5 when the pivoted arm 16 has reached its end position.

Figure 6:
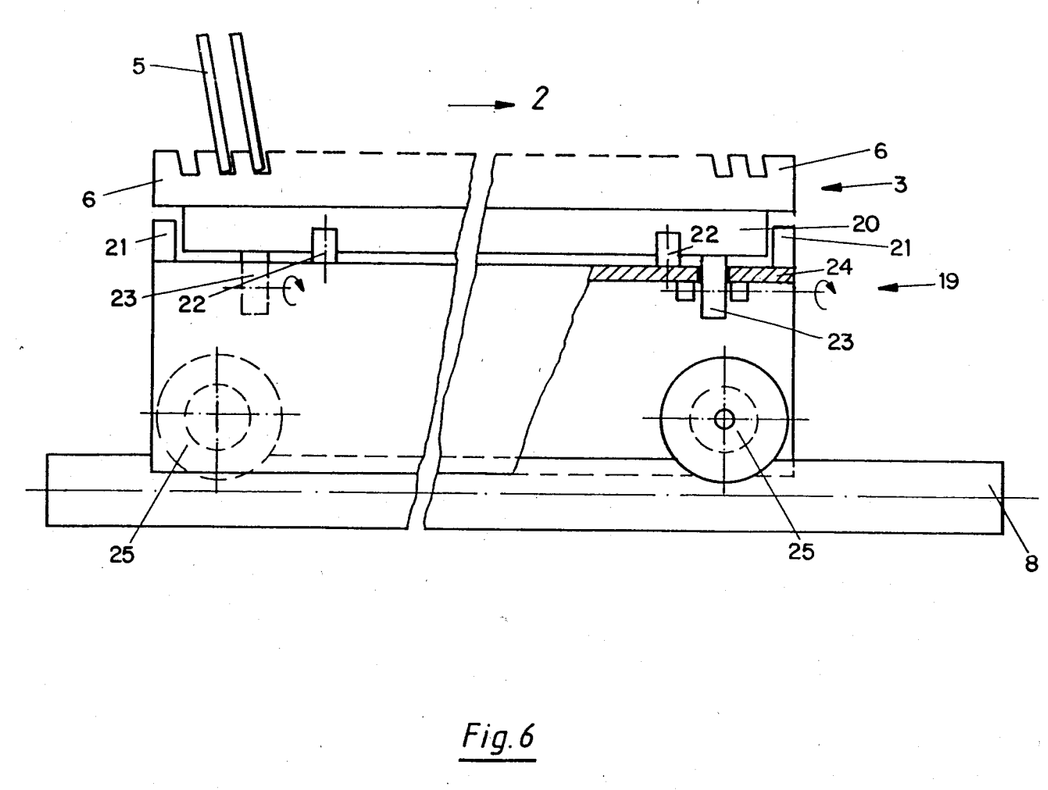
FIG. 6 shows the pallet carriage and a pallet mounted thereon.

FIG. 6 is a side elevation showing the pallet carriage generally designated 19 and the change pallet 3 lying thereon. The pallet 3 is composed of a base plate 20 and a plurality of notched bars 6 and is restrained on the pallet carriage 19 by stops 21 against a movement in the direction of travel 2 and by stops 22 against a movement in the longitudinal direction of the slots 18. The fixed stops 22 may be replaced by movable stops or by a pawl so that the pallets can be fixed on the pallet carriage against a movement in the longitudinal direction of the slots 18 and the pallet can be pushed out in that longitudinal direction. To facilitate the movement of the pallets in the longitudinal direction of the slots 18, a plurality of rollers 23 are rotatably mounted in and protrude above the top 24 of the pallet carriage 19. The pallet carriage 19 is movably mounted on four flanged wheels 25, which rest on the longitudinal tracks 8.

Figure 7:
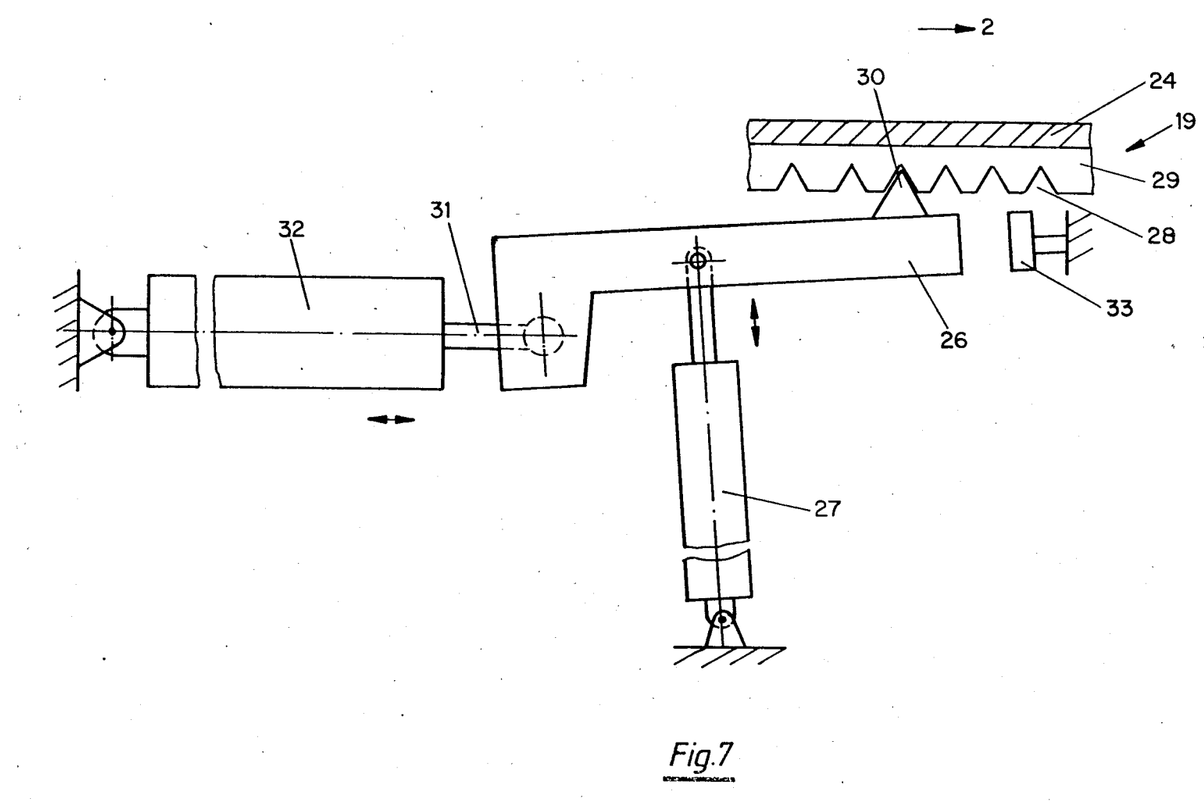
FIG. 7 illustrates the intermittent advance of the pallet carriage.

The pallet carriage 19 is intermittently advanced in the direction of travel 2 by a pawl 26, which is shown in FIG. 7. The pawl 26 can be moved up and down by a hydraulic cylinder 27 and has a nose 30 which snaps into one of the notches 28 of a notched bar 29, which is mounted on the underside of the top 24 of the pallet carriage 19. When the pawl 26 has entered one of the notches 28, the piston rod 31 of the cylinder 32 is extended in the direction of travel 2 until the pawl 26 has struck against an adjustable stop 33. The cylinder 32 and the stop 33 are so adjusted relative to each other that one stroke of the piston rod 31 is exactly equal to the pitch of the notches 28 of the notched bar 29. The cylinder 32 is pivotally secured on the interior of a housing 2a. The housing 2a is shown in FIG. 2. Similarly, the cylinder 27 is secured on the interior of the housing 2a. The stop 33 is secured inside of the housing.

Figure 8:
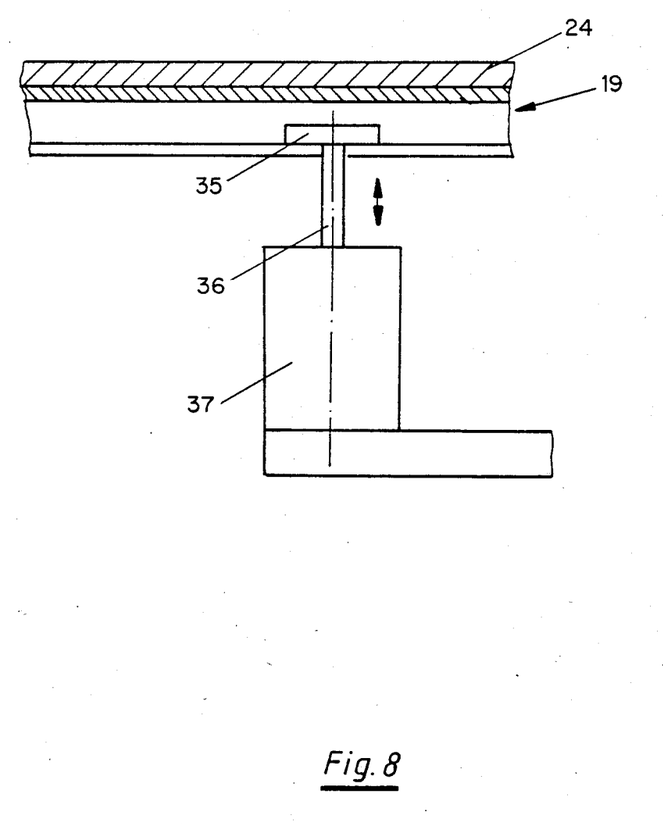
FIG. 8 shows the clamping means for holding the pallet carriage in position.

It is shown in FIG. 8 how the pallet carriage 19 is clamped in position after its forward step. A channel-shaped retaining bar 34 is secured to the underside of the top 24 of the pallet carriage 19 and receives a retaining plate 35, which is forced against the channel bar 34 on the inside thereof by the piston rod 36 of the hydraulic cylinder 37 so that the pallet carriage 19 is clamped in position.

When it is desired to remove printed circuit boards from a pallet and to insert the boards into a processing machine, the apparatus which has been described hereinbefore can be operated to perform the steps described in a reverse sequence.

Figure 9:
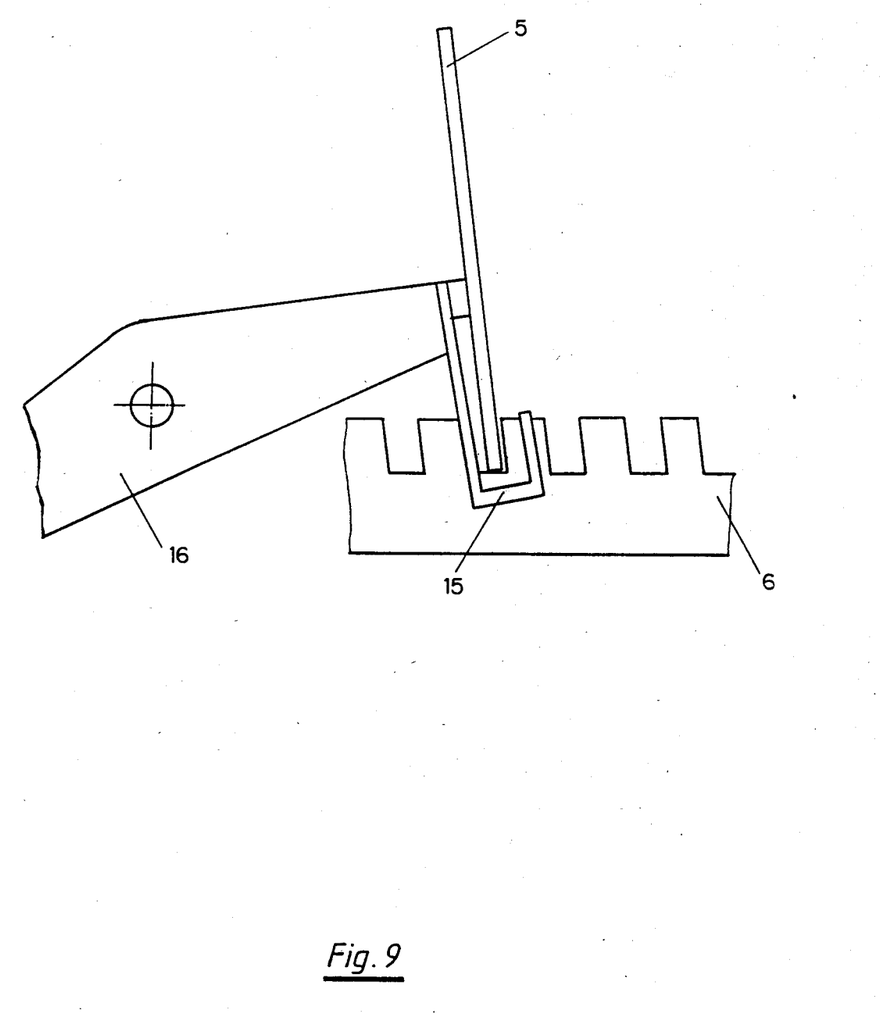
FIG. 9 illustrates an embodiment of a board holder of an apparatus which is used for removing printed circuit boards from a pallet and for inserting such printed circuit boards into a machine. DETAILED DESCRIPTION OF THE PREFERRED EMBODIMENTS Two preferred embodiments of an apparatus in accordance with the invention are illustrated on the drawings.

If the apparatus is to be used only to remove the printed circuit boards from the pallet and to insert the boards into a machine, an embodiment may be used in which the fixed gripping jaws are replaced by the hooks 15 shown in FIG. 9 and the movable gripping jaw shown in FIG. 3 is omitted.

We claim:

1. Apparatus for inserting printed circuit boards into a slotted change pallet for holding a plurality of printed circuit boards in a generally upright orientation and out of contact with each other in respective, transversely spaced apart, parallel slots of said pallet, comprising a board holder, which is mounted to be pivotally movable between upper and lower positions and in said upper position is adapted to receive and grip a printed circuit board when the latter has a generally horizontal orientation, and in said lower position is adapted to hold said printed circuit board at its bottom edge and to release said printed circuit board when the latter has a generally vertical orientation, a roller conveyor for conveying a printed circuit board in a generally horizontal orientation in a predetermined direction of travel to said board holder when the latter is in said upper position, a pallet carriage, which is adapted to carry a change pallet formed with said slots which are at right angles to said direction of travel and adapted to support said printed circuit boards in said slots in a generally vertical orientation, a carriage drive for moving said pallet carriage in said direction of travel to positions in which respective ones of said slots are disposed below said board holder and adapted to receive a printed circuit board in a generally vertical orientation from said board holder when the latter is in said lower position, a board holder drive for pivotally moving said board holder from said upper position to said lower position and from said lower position to said upper position, wherein said board holder comprises a plurality of laterally spaced apart gripping jaws which are arranged to extend into said gaps when said board holder is in said lower position, said board holder comprises pivoted arm means, and each of said pairs of gripping jaws comprises a fixed gripping jaw that is fixed to said arm means and a movable gripping jaw which is mounted on said pivoted arm and is movable relative to said pivoted arm means to clamp said printed circuit board against said fixed gripping jaw and to release said printed circuit board.

2. An apparatus as set forth in claim 1, wherein said fixed and movable gripping jaws are adapted to engage said printed circuit board on its top and bottom surfaces when said printed circuit board has a generally horizontal orientation and said board holder is in said upper position.

3. An apparatus as set forth in claim 2, wherein said pivoted arm means are pivoted on a horizontal pivot which is below said gripping jaws when said board holder is in said upper position.

4. An apparatus as set forth in claim 2, wherein each of said movable gripping jaws consists of a hook.

5. An apparatus as set forth in claim 2, wherein said movable gripping jaws are pivoted to said pivoted arm means and
hydraulic cylinder means are mounted on said pivoted arm means and operatively connected to said movable gripping jaws and operable to move said pivoted gripping jaws to and from said fixed gripping jaws.

6. An apparatus as set forth in claim 1, wherein a plurality of rollers which protrude above said pallet carriage are mounted in said pallet carriage for rotation on axes which extend transverse to said slots and are spaced apart in said direction of travel and engageable by the underside of said change pallet.

7. Apparatus for inserting printed circuit boards into a slotted change pallet for holding a plurality of printed circuit boards in a generally upright orientation and out of contact with each other in respective, transversely spaced apart, parallel slots of said pallet, comprising
a board holder, which is mounted to be pivotally movable between upper and lower positions and in said upper position is adapted to receive and grip a printed circuit board when the latter has a generally horizontal orientation, and in said lower position is adapted to hold said printed circuit board at its bottom edge and to release said printed circuit board when the latter has a generally vertical orientation, a roller conveyor for conveying a printed circuit board in a generally horizontal orientation in a predetermined direction of travel to said board holder when the latter is in said upper position, a pallet carriage, which is adapted to carry a change pallet formed with said slots which are at right angles to said direction of travel and adapted to support said printed circuit boards in said slots in a generally vertical orientation, a carriage drive for moving said pallet carriage in said direction of travel to positions in which respective ones of said slots are disposed below said board holder and adapted to receive a printed circuit board in a generally vertical orientation from said board holder when the latter is in said lower position, and a board holder drive for pivotally moving said board holder from said upper position to said lower position and from said lower position to said upper position, said board holder in said upper position is adapted to grip said printed circuit board at its leading edge as said printed circuit board is conveyed on said conveyor and to hold said printed circuit board at its bottom edge when said board holder is in said lower position, said change pallet comprises a plurality of transversely spaced apart bars, which are transversely separated by gaps and each of which is formed with a plurality of open-topped notches, which are laterally open and spaced apart along said bar and are laterally aligned with respective notches of the others of said bars so that said notches in said bars constitute said slots.

8. An apparatus as set forth in claim 7, wherein
said board holder comprises pivoted arm means and pairs of gripping jaws, and
each of said pairs of gripping jaws comprises a fixed gripping jaw that is fixed to said arm means, and a movable gripping jaw which is mounted on said pivoted arm and is movable relative to said pivoted arm means to clamp said printed circuit board against said fixed gripping jaw and to release said printed circuit board.

9. An apparatus as set forth in claim 8, wherein said fixed and movable gripping jaws are adapted to engage said printed circuit board on its top and bottom surfaces when said printed circuit board has a generally horizontal orientation and said board holder is in said upper position.

10. An apparatus as set forth in claim 8, wherein said pivoted arm means are pivoted on a horizontal pivot which is below said gripping jaws when said board holder is in said upper position.

11. An apparatus as set forth in claim 8, wherein each of said movable gripping jaws consists of a hook.

12. An apparatus as set forth in claim 8, wherein
said movable gripping jaws are pivoted to said pivoted arm means and
hydraulic cylinder means are mounted on said pivoted arm means and operatively connected to said movable gripping jaws and operable to move said pivoted gripping jaws to and from said fixed gripping jaws.

13. An apparatus as set forth in claim 7, wherein said carriage drive comprises a pawl for engaging said pallet carriage and pawl-operating means for moving by means of said pawl said pallet carriage in increments corresponding to the pitch of said slots, said pallet carriage is provided with pawl-engageable means for cooperation with said pawl, said carriage drive comprises a hydraulic cylinder for actuating said pawl, and a hydraulic cylinder is connected to said pawl and operable to move said pawl into and out of engagement with said pawl-engageable means.

14. An apparatus as set forth in claim 13, wherein said pawl-engageable means are elongate and extend in said direction of travel, a retaining bar extending parallel to said pawl-engageable means is secured to said pallet carriage on the underside thereof, a retaining member is provided, which is movable into and out of engagement with said retaining bar, and a hydraulic cylinder is provided for moving said retaining member into and out of engagement with said retaining bar to fix in position and to release said pallet carriage.

15. An apparatus as set forth in claim 14, wherein said retaining bar is channel-shaped and said retaining member is movable into and out of engagement with the inside surface of said retaining bar.

16. Apparatus for inserted printed circuit boards into a slotted change pallet for holding a plurality of printed circuit boards in a generally upright orientation and out of contact with each other in respective, transversely spaced apart, parallel slots in said pallet, comprising a board holder, which is mounted to be pivotally movable between upper and lower positions and in said upper position is adapted to receive and grip a printed circuit board when the latter has a generally horizontal orientation, and in said lower position is adapted to hold said printed circuit board at its bottom edge and to release said printed circuit board when the latter has a generally vertical orientation, a roller conveyor for conveying a printed circuit board in a generally horizontal orientation in a predetermined direction of travel to said board holder when the latter is in said upper position, a pallet carriage, which is adapted to carry a change pallet formed with said slots which are at right angles to said direction of travel and adapted to support said printed circuit boards in said slots in a generally vertical orientation, a carriage drive for moving said pallet carriage in said direction of travel to positions in which respective ones of said slots are disposed below said board holder and adapted to receive a printed circuit board in a generally vertical orientation from said board holder when the latter is in said lower position, and a board holder drive for pivotally moving said board holder from said upper position to said lower position and from said lower position to said upper position, wherein said carriage drive comprises a pawl for engaging said pallet carriage and pawl-operating means for moving by means of said pawl, said pallet carriage in increments corresponding to the pitch of said slots, said pallet carriage is provided with pawl-engageable means for cooperation with said pawl, said carriage drive comprises a hydraulic cylinder for actuating said pawl, and a hydraulic cylinder is connected to said pawl and operable to move said pawl into and out of engagement with said pawl-engageable means.

17. Apparatus for inserting printed circuit boards into a slotted change pallet for holding a plurality of printed circuit boards in a generally upright orientation and out of contact with each other in respective, transversely spaced apart, parallel slots of said pallet, comprising a board holder, which is mounted to be pivotally movable between upper and lower positions and in said upper position is adapted to receive and grip a printed circuit board when the latter has a generally horizontal orientation, and in said lower position is adapted to hold said printed circuit board at its bottom edge and to release said printed circuit board when the latter has a generally vertical orientation, a roller conveyor for conveying a printed circuit board in a generally horizontal orientation in a predetermined direction of travel to said board holder when the latter is in said upper position, a pallet carriage, which is adapted to carry a change pallet formed with said slots which are at right angles to said direction of travel and adapted to support said printed circuit boards in said slots in a generally vertical orientation, a carriage drive for moving said pallet carriage in said direction of travel to positions in which respective ones of said slots are disposed below said board holder and adapted to receive a printed circuit board in a generally vertical orientation from said board holder when the latter is in said lower position, and a board holder drive for pivotally moving said board holder from said upper position to said lower position and from said lower position to said upper position, wherein said carriage drive comprises a pawl for engaging said pallet carriage and pawl-operating means for moving by means of said pawl, said pallet carriage in increments corresponding to the pitch of said slots, said pallet carriage is provided with pawl-engageable means for cooperation with said pawl, said carriage drive comprises a hydraulic cylinder for actuating said pawl, said pawl-engageable means are elongate and extend in said direction of travel, a retaining bar extending parallel to said pawl-engageable means is secured to said pallet carriage on the underside thereof, a retaining member is provided, which is movable into and out of engagement with said retaining bar, and a hydraulic cylinder is provided for moving said retaining member into and out of engagement with said retaining bar to fix in position and to release said pallet carriage.

18. An apparatus as set forth in claim 17, wherein said retaining bar is channel-shaped and said retaining member is movable into and out of engagement with the inside surface of said retaining bar.

* * * * *